US011289011B2

(12) United States Patent
Wei et al.

(10) Patent No.: US 11,289,011 B2
(45) Date of Patent: Mar. 29, 2022

(54) POWER LINE COMMUNICATION IN A DISPLAY DEVICE WITH DISTRIBUTED DRIVER CIRCUITS

(71) Applicant: Huayuan Semiconductor (Shenzhen) Limited Company, Shenzhen (CN)

(72) Inventors: Chih-Chang Wei, Taoyuan (TW); Jyun-Long Lin, Zhubei (TW); Yung-Ting Chen, Zhubei (TW); Li-Lun Chi, Taipei (TW); Junjie Zheng, Cupertino, CA (US); Richard Landry Gray, Saratoga, CA (US)

(73) Assignee: Huayuan Semiconductor (Shenzhen) Limited Company, Shenzhen (CN)

( * ) Notice: Subject to any disclaimer, the term of this patent is extended or adjusted under 35 U.S.C. 154(b) by 30 days.

(21) Appl. No.: 16/923,031

(22) Filed: Jul. 7, 2020

(65) Prior Publication Data
US 2021/0056892 A1 Feb. 25, 2021

Related U.S. Application Data

(60) Provisional application No. 62/891,285, filed on Aug. 24, 2019, provisional application No. 62/907,657, filed on Sep. 29, 2019.

(51) Int. Cl.
*G09G 3/32* (2016.01)
*H01L 25/075* (2006.01)
(Continued)

(52) U.S. Cl.
CPC ......... *G09G 3/32* (2013.01); *H01L 23/49827* (2013.01); *H01L 24/48* (2013.01);
(Continued)

(58) Field of Classification Search
CPC ......... G09G 2330/021; G09G 2330/02; G09G 3/3406; G09G 3/3696; G09G 3/2014;
(Continued)

(56) References Cited

U.S. PATENT DOCUMENTS 8,125,472 B2  2/2012  Cok et al.
8,207,954 B2  6/2012  Cok et al.
(Continued)

FOREIGN PATENT DOCUMENTS

CN    102077266 A    5/2011
CN    102215616 A    10/2011
(Continued)

OTHER PUBLICATIONS

Chinese Office Action, China National Intellectual Property Administration Patent Application No. 202010837219.2, dated Jul. 16, 2021, 15 pages.
(Continued)

*Primary Examiner* — Dong Hui Liang
(74) *Attorney, Agent, or Firm* — Fenwick & West LLP (57) ABSTRACT

Embodiments relate to a display device that includes a control circuit, an array of light emitting diode (LED) zones, and an array of driver circuits that are distributed in the display area. An integrated LED and driver circuit includes one or more LEDs of a LED zone and one or more driver circuits integrated on a substrate in a single package with the LED and driver circuit vertically stacked over a substrate. An addressing scheme configures addresses of the driver circuits using address lines that connect between adjacent driver circuits. Control data is provided to the driver circuits via a power line communication signal that provides both a supply voltage and digital data modulated onto the supply voltage.

20 Claims, 10 Drawing Sheets

(51) Int. Cl.
  *H01L 25/16* (2006.01)
  *H01L 23/00* (2006.01)
  *H01L 23/498* (2006.01)
  *H01L 33/62* (2010.01)
  *H05B 45/28* (2020.01)

(52) U.S. Cl.
  CPC ........ *H01L 25/0753* (2013.01); *H01L 25/167* (2013.01); *H01L 33/62* (2013.01); *H05B 45/28* (2020.01); *G09G 2310/0202* (2013.01); *G09G 2310/0297* (2013.01); *G09G 2310/08* (2013.01); *G09G 2320/064* (2013.01); *G09G 2320/0626* (2013.01); *G09G 2330/028* (2013.01); *H01L 2224/48225* (2013.01)

(58) Field of Classification Search
  CPC .. G09G 3/3648; G09G 3/3233; G09G 3/3677; G09G 3/22; G09G 3/342; G09G 3/3611; G09G 3/32; G09G 3/3426; G09G 3/3688; G09G 2320/064; G09G 2320/0646; G09G 2320/0233; G09G 2300/0857; G09G 2310/027; G09G 2310/06; G09G 5/006
  See application file for complete search history.

(56) References Cited

U.S. PATENT DOCUMENTS

| | | | |
|---|---|---|---|
| 8,624,882 B2 | 1/2014 | Cok et al. | |
| 8,803,857 B2 | 8/2014 | Cok | |
| 8,890,425 B2 | 11/2014 | Zeng | |
| 8,928,701 B2 | 1/2015 | Kim et al. | |
| 10,845,641 B2 | 11/2020 | Zha et al. | |
| 2009/0021504 A1* | 1/2009 | Oh Yang | G09G 5/003 345/211 |
| 2010/0123694 A1 | 5/2010 | Cok et al. | |
| 2010/0309100 A1 | 12/2010 | Cok et al. | |
| 2011/0069095 A1 | 3/2011 | Kim et al. | |
| 2011/0096099 A1 | 4/2011 | Yamamoto et al. | |
| 2011/0109228 A1* | 5/2011 | Shimomura | H05B 45/37 315/113 |
| 2012/0140013 A1 | 6/2012 | Komai et al. | |
| 2012/0206421 A1 | 8/2012 | Cok et al. | |
| 2012/0206499 A1 | 8/2012 | Cok | |
| 2012/0299480 A1* | 11/2012 | Peting | H05B 47/185 315/113 |
| 2013/0234612 A1 | 9/2013 | Zeng | |
| 2014/0025999 A1* | 1/2014 | Kessler | G06F 9/4411 714/43 |
| 2014/0176352 A1 | 6/2014 | Hussain et al. | |
| 2014/0232755 A1* | 8/2014 | Wang | G09G 3/3696 345/690 |
| 2017/0357582 A1 | 12/2017 | Decloedt et al. | |
| 2020/0035147 A1 | 1/2020 | Ban et al. | |
| 2020/0051484 A1 | 2/2020 | Yashiki | |
| 2020/0082751 A1 | 3/2020 | Wu et al. | |
| 2020/0235078 A1* | 7/2020 | Jang | H01L 33/24 |
| 2020/0266180 A1 | 8/2020 | Pendse | |
| 2020/0271994 A1 | 8/2020 | Zha et al. | |
| 2021/0043129 A1 | 2/2021 | Yeh et al. | |

FOREIGN PATENT DOCUMENTS

| | | |
|---|---|---|
| CN | 102223743 A | 10/2011 |
| CN | 102282675 A | 12/2011 |
| CN | 102460549 A | 5/2012 |
| CN | 102612227 A | 7/2012 |
| CN | 103348402 A | 10/2013 |
| CN | 103348403 A | 10/2013 |
| CN | 103476184 A | 12/2013 |
| CN | 104919400 A | 9/2015 |
| CN | 205016161 U | 2/2016 |
| CN | 106876406 A | 6/2017 |
| CN | 108303824 A | 7/2018 |
| CN | 109031779 A | 12/2018 |
| CN | 109741685 A | 5/2019 |
| CN | 109785760 A | 5/2019 |
| CN | 109887462 A | 6/2019 |

OTHER PUBLICATIONS

United States Office Action, U.S. Appl. No. 16/923,028, filed Jun. 30, 2021, 40 pages.
United States Office Action, U.S. Appl. No. 16/923,036, filed May 28, 2021, 29 pages.
Chinese Office Action, China National Intellectual Property Administration Patent Application No. 202010837221.X, dated Aug. 2, 2021, 34 pages.
Chinese Office Action, China National Intellectual Property Administration Patent Application No. 202010838023.5, dated Aug. 2, 2021, 23 pages.

* cited by examiner

FIG. 6

POWER LINE COMMUNICATION IN A DISPLAY DEVICE WITH DISTRIBUTED DRIVER CIRCUITS

CROSS-REFERENCE TO RELATED APPLICATIONS

This application claims the benefit of U.S. Provisional Application No. 62/891,285, filed Aug. 24, 2019, and U.S. Provisional Application No. 62/907,657, filed Sep. 29, 2019, which are incorporated by reference in their entirety.

BACKGROUND

This disclosure relates generally to light emitting diodes (LEDs) and LED driver circuitry for a display, and more specifically to a display architecture with distributed driver circuits.

LEDs are used in many electronic display devices, such as televisions, computer monitors, laptop computers, tablets, smartphones, projection systems, and head-mounted devices. Modern displays may include well over ten million individual LEDs that may be arranged in rows and columns in a display area. In order to drive each LED, current methods employ driver circuitry that requires significant amounts of external chip area that impacts the size of the display device.

SUMMARY

Embodiments relate to a display device that includes an LED and driver circuit integrated into a single package. The display device includes a control circuit, an array of driver circuits distributed in a display area of the device, and an array of LED zones. Each LED zone comprises one or more LEDs that generate light in response to respective driver currents. The array of driver circuits each drive one or more of the LED zones by controlling the respective driver currents through the LEDs in the LED zones in response to driver control signals from the control circuit. The one or more LEDs in a LED zone and the driver circuit that drives the one or more LEDs in the LED zone are integrated and vertically stacked over a substrate in an integrated package.

Embodiments also relate to an integrated LED and driver circuit for a display device. The integrated LED and driver circuit includes a substrate, one or more driver circuits in a driver circuit layer, and one or more LEDs in an LED layer. The LED generates light in response to a driver current. The driver circuit drives the LED by controlling the driver current in response to a driver control signal. A conductive redistribution layer in between the driver circuit layer and the LED layer electrically connects the LED to the driver circuit for supplying the driver current. The LED layer and conductive redistribution layer are vertically stacked over the driver circuit layer.

Embodiments also relate to a driver circuit for a display device utilizing drivers distributed in a display area. The driver circuit includes control logic to operate in at least an addressing mode and an operational mode. In the operational mode, the control logic obtains a driver control signal from a power line communication signal and controls a driver current based on the driver control signal. In the addressing mode, the control logic obtains an incoming addressing signal, stores an address for the driver circuit specified by the incoming addressing signal, and generates an outgoing addressing signal based on the incoming addressing signal. A data input pin receives the incoming addressing signal during the addressing mode. In the operational mode, a power line communication input pin receives the power line communication signal comprising a supply voltage modulated to encode the driver control signal. An output pin sinks the driver current during the operational mode and outputs the outgoing addressing signal during the addressing mode. The driver circuit further includes a ground pin to provide a path to ground.

Embodiments also relate to a display device that operates using a power line communication technique. The display device includes an array of LED zones each comprising one or more LEDs that generate light in response to respective driver currents. The display device further includes a group of driver circuits to each drive at least one of the LED zones by controlling the respective driver currents in response to driver control signals. Each driver circuit includes a power line communication input pin for receiving a power line communication signal. The power line communication signal supplies power to the driver circuit and encodes one of the driver control signals as digital data modulated onto a supply voltage. The display device further includes a power communication line providing the power line communication signal to the power line communication input pin of each of the driver circuits in the group of driver circuits. The display device further includes a control circuit for generating the power line communication signal and providing the power line communication signal on the power communication line to power the group of driver circuits and to control the display device via the driver control signals.

Embodiments also relate to a driver circuit for a display device that operates according to a power line communication technique. The driver circuit includes a power line communication input pin configured to receive a power line communication signal. The driver circuit further includes power regulation circuitry to generate a supply voltage based on a direct current component of the power line communication signal and to generate a driver control signal based on a modulated component of the power line communication signal. The driver circuit further includes control logic powered by the supply voltage to receive the driver control signal and to generate a current control signal for controlling a driver current through an LED zone via an output pin based on the driver control signal.

Embodiments also relate to a method for controlling a driver circuit for a display device using a power line communication technique. A power line communication signal is received at a power line communication input pin. Power regulation circuitry generates a supply voltage based on a direct current component of the power line communication signal and generates a driver control signal based on a modulated component of the power line communication signal. Control logic is powered by the supply voltage. The control logic receives the driver control signal and generates a current control signal for controlling a driver current through an LED zone of the display device based on the driver control signal.

Embodiments also relate to a display device that utilizes a chained addressing scheme to provide addresses to driver circuits coupled to a shared control data line. The display device includes a control circuit to generate an address communication signal during an addressing mode of the display device and to generate driver control signals during an operational mode of the display device. The display device further includes an array of LED zones each comprising one or more LEDs that generate light in response to respective driver currents. A group of driver circuits each drive respective LED zones in the operational mode by controlling the respective driver currents in response to the driver control signals. When operating in the addressing mode, each of the driver circuits in the group of driver circuits receives an incoming addressing signal via a data input pin, stores an address specified by the incoming addressing signal, and generates an outgoing addressing signal for outputting via an output pin. A set of address communication lines couple between the output pins and the data input pins of adjacent driver circuits in the group of driver circuits.

Embodiments also relate to a driver circuit for driving an LED zone of a display device that utilizes a chained addressing scheme to provide addresses to driver circuits coupled to a shared control data line. The driver circuit includes a data input pin configured to receive an address communication signal that provides an address as digital data during an addressing mode. Control logic is configured to store the address and increment the address during the addressing mode and to generate a current control signal for controlling driver current through the LED zone based on a driver control signal during an operational mode. An output pin provides the incremented address as digital data to a successive driver circuit during the addressing mode of the driver circuit and sinks the driver current through the LED zone during the operational mode. The driver circuit further includes a ground pin configured to provide a path for the driver current to ground.

Embodiments also relate to a method for operating a driver circuit for driving an LED zone of a display device using a chained addressing scheme to provide addresses to driver circuits coupled to a shared control data line. The driver circuit activates an enable signal to enable an address driver during an addressing mode. The driver circuit receives at a data input pin during the addressing mode, an address communication signal that provides an address as digital data. The driver circuit stores the address to a storage medium, increments the address, and provides the incremented address at an output pin to a successive driver circuit. The driver circuit deactivates the enable signal to disable the address driver during an operational mode and to enable the driver circuit to drive the LED zone via the output pin.

BRIEF DESCRIPTION OF THE DRAWINGS

The teachings of the embodiments of the present invention can be readily understood by considering the following detailed description in conjunction with the accompanying drawings.

The features and advantages described in the specification are not all inclusive and, in particular, many additional features and advantages will be apparent to one or ordinary skill in the art in view of the drawings, specification, and claims. Moreover, it should be noted that the language used in the specification has been principally selected for readability and instructional purposes, and may not have been selected to delineate or circumscribe the inventive aspect matter.

DETAILED DESCRIPTION OF EMBODIMENTS

The Figures (FIGs.) and the following description relate to the preferred embodiments of the present invention by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the disclosure described herein.

Figure 1A:
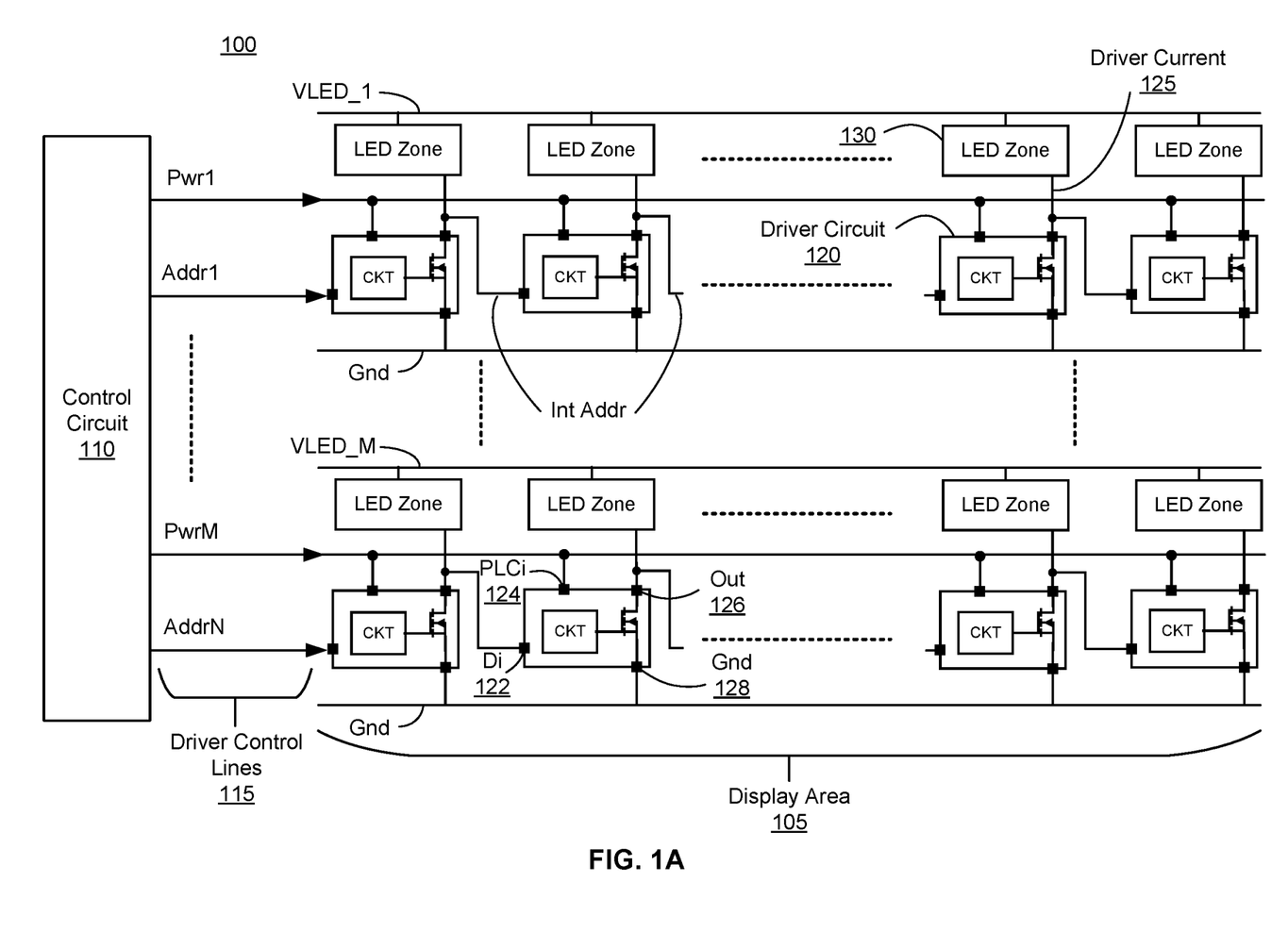
FIG. 1A is a circuit diagram of a display device, according to one embodiment.

FIG. 1A is a circuit diagram of a display device 100 for displaying images or video, according to one embodiment. In various embodiments, the display device 100 may be implemented in any suitable form-factor, including a display screen for a computer display panel, a television, a mobile device, a billboard, etc. The display device 100 may comprise a liquid crystal display (LCD) device or an LED display device. In an LCD display device, LEDs provide white light backlighting that passes through liquid crystal color filters that control the color of individual pixels of the display. In an LED display device, LEDs are directly controlled to emit colored light corresponding to each pixel of the display. The display device 100 may include a display area 105, driver control lines 115, and a control circuit 110. In various embodiments, the display device 100 may include additional, fewer, or different components.

The display area 105 comprises an array of pixels for displaying images based on data received from the control circuit 110. In various embodiments, the display area 105 may include LED zones 130, a set of distributed driver circuits 120, power supply lines including VLED lines (e.g., VLED_1, . . . VLED_M) and ground (GND) lines, and various signaling lines (e.g., a set of address communication lines Int Addr connecting adjacent driver circuits 120 and power communication lines Pwr). In various embodiments, the display area 105 may include additional, fewer, or different components. The VLED lines provide power to the LED zones 130 (e.g., by supplying power to the anode of the LEDs in the LED zones 130). The GND lines provide a path to ground for the LED zones 130 and the driver circuits 120.

As will be described in further detail below, the display area 105 may be physically structured such that the LED zones 130 are stacked over the driver circuits 120. In other words, an array of LED zones 130 are arranged in a first x-y plane and an array of driver circuits 120 are arranged in a second x-y plane parallel to the first x-y plane. In one configuration, each LED zone 130 is stacked over (i.e., in the z direction) the corresponding driver circuit 120 that drives it. Furthermore, the components of the display area 105 (e.g., the LED zones 130 and the driver circuits 120) may be integrated on the same substrate and in a same package as further described in FIGS. 4A-4C. This structure enables a display device 100 in which the driver circuits 120 are distributed in the display area 105 and therefore enables a more compact display device 100 than in devices where the driver circuits 120 are external to the display area 105.

The LED zones 130 may be arranged in a two-dimensional array (e.g., in rows and columns). The LED zones 130 each comprise one or more LEDs that each generate light that has a brightness dependent on its respective driver currents 125. In an LCD display, an LED zone 130 may comprise one or more LEDs that provides backlighting for a backlighting zone, which may include a one-dimensional or two-dimensional array of pixels. In an LED display, the LED zone 130 may comprise one or more LEDs corresponding to a single pixel of the display device 100 or may comprise a one-dimensional array or two-dimensional array of LEDs corresponding to an array of pixels (e.g., one or more columns or rows). For example, in one embodiment, the LED zone 130 may comprise one or more groups of red, green, and blue LEDs that each correspond to a sub-pixel of a pixel. In another embodiment, the LED zone 130 may comprise one or more groups of red, green, and blue LED strings that correspond to a column or partial column of sub-pixels or a row or partial row of sub-pixels. For example, an LED zone 130 may comprise a set of red sub-pixels, a set of green sub-pixels, or a set of blue sub-pixels.

The LEDs may be organic light emitting diodes (OLEDs), inorganic light emitting diodes (ILEDs), mini light emitting diodes (mini-LEDs) (e.g., having a size range between 100 to 300 micrometers), micro light emitting diodes (micro-LEDs) (e.g., having a size of less than 100 micrometers), white light emitting diodes (WLEDs), active-matrix OLEDs (AMOLEDs), transparent OLEDs (TOLEDs), or some other type of LEDs.

The driver circuits 120 drive the LED zones 130 by controlling the respective driver currents 125 to the LED zones 130 in response to driver control signals. In one embodiment, the driver circuits 120 are distributed in the display area 105 and arranged in a two-dimensional array (e.g., in rows and columns) in correspondence with the LED zones 130. In an embodiment, a driver circuit 120 controls a driver current 125 supplied by VLED via an output pin 126 to control brightness of one LED zone 130 based on the driver control signals. For example, brightness of the LED zone 130 generally increases with increasing driver current 125.

In an embodiment, the driver circuits 120 may be arranged in groups that share a common set of driver control lines 115, VLED lines, and GND lines. For example, the driver circuits 120 within a group are coupled to a common power communication line Pwr and are each indirectly controlled by a common address communication line Addr (as will be described in further detail below). In an example embodiment, the driver circuits 120 in one group are daisy-chained together via a set of address communication lines that couple adjacent driver circuits 120 (e.g., from the output pin 126 of one driver circuit 120 to a data input pin 122 of the next driver circuit 120). In the illustrated embodiment of FIG. 1A, each row of the display device corresponds to a group of driver circuits 120 that shares common driver control lines 115, VLED lines, and GND lines. In other embodiments, a group of driver circuits 120 may correspond to a partial row of the display area 105 or a full or partial column of the display area 105. In another embodiment, a group of driver circuits 120 may correspond to a block of adjacent driver circuits 120 that may span multiple rows and columns.

The driver circuits 120 may operate in various modes including at least an addressing mode, a configuration mode, and an operational mode. During the addressing mode, the control circuit 110 assigns a unique address to each of the driver circuits 120 within a group that is utilized to broadcast further commands and data in the configuration and operational modes. During the configuration mode, the control circuit 110 configures the driver circuits 120 with one or more operating parameters (e.g., overcurrent thresholds, overvoltage thresholds, clock division ratios, and/or slew rate control). During the operational mode, the control circuit 110 provides control data to the driver circuits 120 that causes the driver circuits 120 to control the respective driver currents 125 to the LED zones 130, thereby controlling brightness. In other embodiments, the modes of operation of the display device 100 may include additional, fewer, or different modes of operation. For example, the modes of operation may include an initialization mode and an off mode.

The driver circuit 120 may include a four-pin configuration as shown in the illustrated example of FIG. 1. In the four-pin configuration, the driver circuit 120 may include a data input pin (Di) 122, a power line communication input pin (PLCi) 124, an output pin (Out) 126, and a ground pin (Gnd) 128. In an embodiment, the output 126 may instead comprise a set of pins to control multiple channels of the LED zone 130. For example, the output 126 may include three pins to control red, green, and blue channels of the LED zones 130.

The data input pin 122 is used in the addressing mode to receive an incoming addressing signal via one of the common address communication lines (e.g., Addr1, Addr2, . . . AddrN) from the control circuit 110 (in the case of the first driver circuit 120 in each group) or via one of the address communication lines Int Addr coupling adjacent driver circuits 120 (in the case of remaining driver circuits 120 in each group not directly coupled to the control circuit 110). The incoming addressing signal may be a digital signal that specifies an address of each respective driver circuit 120 as will be described in further detail below. The first driver circuit 120 in each group stores the address specified by the incoming addressing signal and generates an outgoing addressing signal for outputting via the output pin 126. For example, the driver circuit 120 may increment the address by 1 or by another fixed amount and send the incremented address as an outgoing addressing signal to the data input pin 122 of the next driver circuit 120 in the group. Waveforms illustrating the addressing scheme are described in further detail in FIG. 1C.

The output pin 126 serves a dual-purpose dependent on the mode of operation. In the addressing mode of the display device 100, the output pin 126 provides the outgoing addressing signal to the next driver circuit 120 in the group of driver circuits 120 as described above. In the operational mode of the display device 100, the output pin 126 is coupled to sink current from a corresponding LED zone 130 to control supply of the driver current 125. In one embodiment, the driver circuit 120 includes more than one output pin 126. For example, in an LED display, the LED zone 130 may comprise three or more LEDs or LED strings corresponding to three sub-pixels (e.g., a red sub-pixel, a green sub-pixel, and a blue sub-pixel), and the driver circuit 120 may include three output pins 126, one for each color channel.

Figure 1B:
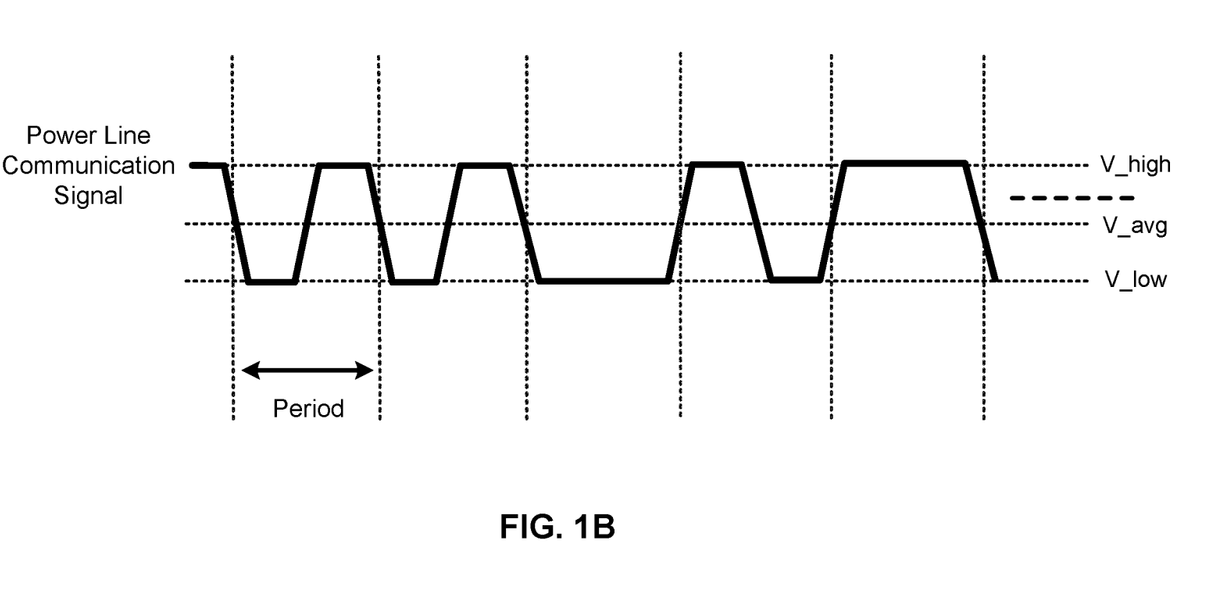
FIG. 1B is a waveform diagram illustrating an example waveform of a power line communication signal, according to one embodiment.
Figure 1C:
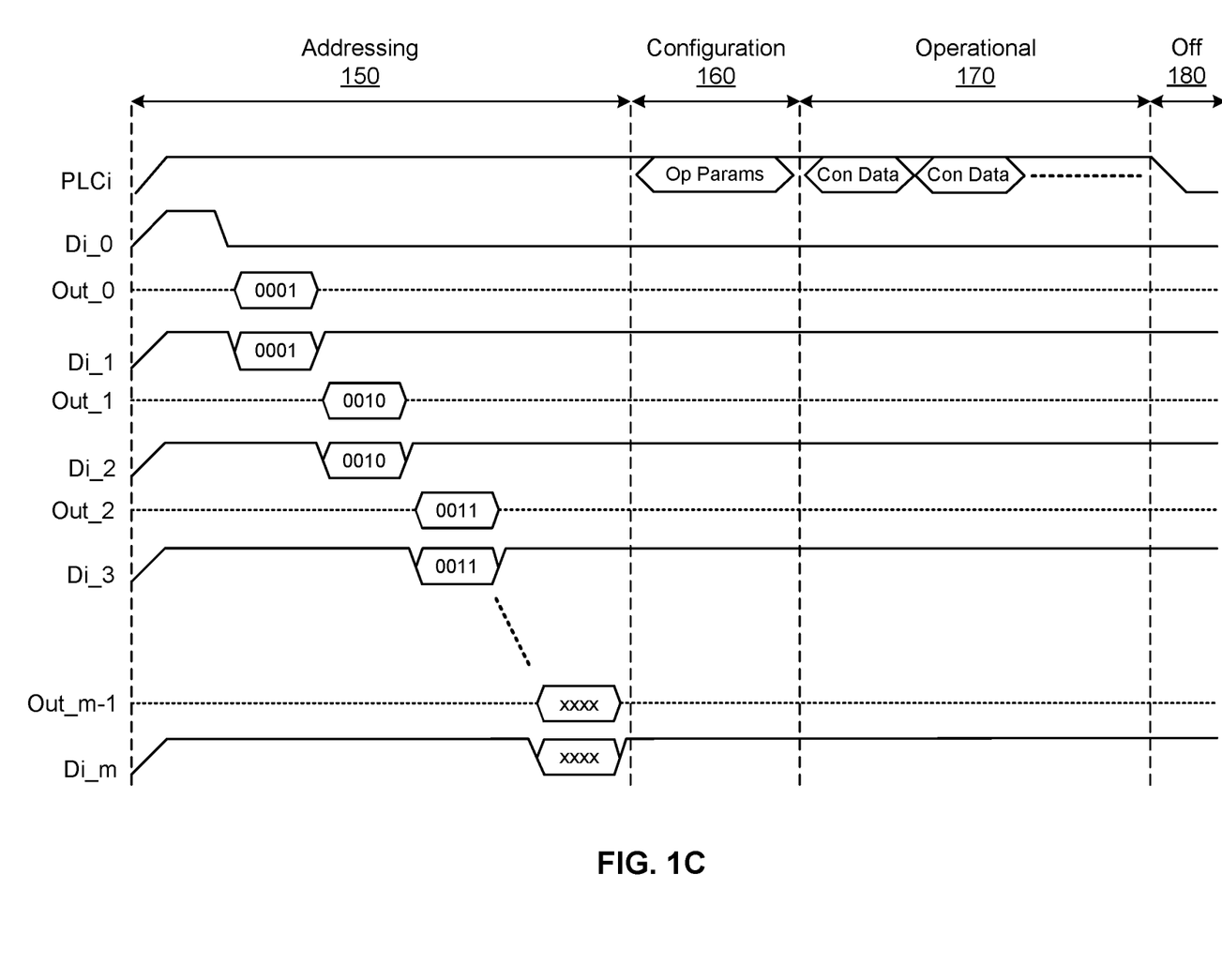
FIG. 1C is a waveform diagram illustrating the operational modes of the display device, according to one embodiment.

The power line communication input pin 124 is configured to receive a power line communication signal from the control circuit 110 via the common power communication lines (e.g., Pwr1, Pwr2, . . . PwrM) for each group. The power line communication signal includes a supply voltage that may be modulated to encode the driver control signal or other control information as digital data. For example, the power line communication signal may encode operating parameter information or control data information for operating the driver circuit 120. Specifically, during the configuration mode, the power line communication signal provides as digital data, one or more operating parameters (e.g., various overcurrent thresholds or overvoltage thresholds to protect the LEDs from overstress, different clock division ratios, and slew rate control of the driver current 125). During the operational mode, the power line communication signal provides control data (e.g., brightness control information) for the LED zones 130. The brightness control information may include one or more address words to identify a driver circuit 120 within a group of the driver circuits 120 and one or more data words for controlling brightness of the LED zone 130 by controlling the driver current 125 of the identified driver circuit 120. FIGS. 1B and 1C provide example waveforms associated with the power line communication signal. In some embodiments, the power line communication signal supplies a direct current voltage between 3 and 12 volts for the supply voltage. In one embodiment, the power line communication signal may provide a power supply voltage of more than 4.5 volts with a digital data signal having a maximum data rate of up to 2 megahertz (MHz) with a 0.5 peak-to-peak voltage signal.

The ground pin 128 is configured to provide a path to a ground line for the driver circuit 120, which may be common to the corresponding LED zone 130.

The control circuit 110, illustrated in FIG. 1A, generates the address communication signal and the power line communication signal to control the display area 105 via the common driver control lines 115 (as described in further detail above). In one example implementation, a number (M) of common power communication lines and a number (N) of common address communication lines are equal (e.g., M=N).

In another embodiment, a shared power line provides power to both the driver circuits 120 and the LED zones 130. Instead of using power line communication, a digital signal uses clock-less shift registers to serially shift data into the driver circuits 120. The clock-less shift register can be implemented in a number of ways. In one embodiment, biphase mark code encoding is used to extract a clock and shift data into the driver circuits 120. The data could also be shifted all the way through the each of the driver circuits 120 in the serial chain and then shifted out again to be used for error detection. In this embodiment, data is written to all the driver circuits 120 each time the brightness control signal changes. In this embodiment, the driver circuits 120 are not necessarily individually addressable.

FIG. 1B is a waveform diagram illustrating an example waveform of a power line communication signal, according to one embodiment. The power line communication signal switches between high data voltages V_high and low data voltages V_low to encode the digital data (e.g., operating parameters or brightness control information) that results in an average voltage of approximately V_avg. In one example embodiment, the high data voltage V_high is 5.5 volts, the low data voltage V_low is 4.5 volts, and the average voltage V_avg is 5 volts. The digital data may be encoded using biphase mark code encoding. In this encoding scheme, logic values are represented by the presence or absence of transitions in each period. For example, periods including a transition may represent logic high values and periods without transitions may represent logic low values. Furthermore, in this encoding, the signal also transitions between logic levels in between each period. This encoding scheme beneficially ensures that the power line communication signal maintains an average voltage V_avg very close to the midpoint between the logic levels in order to provide a relatively stable direct current supply voltage that can be extracted from the power line communication signal to power the driver circuits 120. Another advantage of this scheme is that it does not require a separate clock signal and can be implemented on a single wire.

FIG. 1C is a waveform diagram illustrating the operational modes of the display device 100, according to one embodiment. The three modes of operation (i.e., the addressing mode 150, the configuration mode 160, and the operational mode 170) of the display device 100 are depicted along with an off mode 180. FIG. 1C illustrates the power line communication signal received at a power line communication input pin (PLCi) 124, the address communication signals received at the data input pins 122 (e.g., Di_0, Di_1, . . . Di_m), and the address communication signals provided by the output pins 126 (e.g., Out_0, Out_1, . . . Out_m−1) of the driver circuits 120 in a group of driver circuits 120 during the various modes of operation.

During the addressing mode 150 of operation, the power line communication signal received at the power line communication input pin 124 transitions from low to high (i.e., the driver circuits 120 begin to receive a supply voltage) at the beginning of the addressing mode 150. The address communication signals propagate through the data input pins 122 and output pins 126 of the driver circuits 120 to assign the respective addresses to the driver circuits 120. For instance, the control circuit 110 outputs a logic high signal on the common address communication line Addrn for the group n and the first driver circuit 120 in group n of driver circuits 120 receives the high signal at its data input pin 122 (i.e., Di_0) as an incoming addressing signal. Responsive to detecting the high signal on Di_0, the driver circuit sets its address to an initial address value (e.g., 0000). The first driver circuit 120 stores the address, increments the address value (i.e., increases the address value by one), and provides the incremented address (e.g., 0001) as an outgoing addressing signal via the output pin 126 (i.e., Out_0) and the address communication line Int Addr. The next (successive) driver circuit 120 in group n receives the incremented address (i.e., 0001) at its data input pin 122 (i.e., Di_1) as an incoming addressing signal. The driver circuit 120 similarly stores the address 0001, increments the address, and provides the incremented address (e.g., 0010) as an outgoing addressing signal via the output pin 126 (i.e., Out 1) and the address communication line Int Addr to the next driver circuit 120 in group n. The progression of receiving and storing an address, incrementing the address, and sending the incremented address onto the next driver circuit 120 continues until the addressing mode completes (i.e., all driver circuits 120 in a group of driver circuits 120 have been assigned an address). In alternative embodiments, a different arbitrary addressing scheme may be used in which each driver circuit 120 may generate the next address according to some other function that is not necessarily incrementing. For example, the driver circuits 120 may decrement the address, generate random addresses, or apply some other arbitrary function to generate new addresses.

During the configuration mode 160, the power line communication signal received at the power line communication input pin 124 provides various operating parameters (Op Params) as digital data on the power line communication input pin 124.

During the operational mode 170, the power line communication signal provides control data (Con Data) as digital data modulated onto the supply voltage. The Con Data may be updated with each image frame or video frame. The operational mode 170 continues until the power line communication signal transitions from high to low (i.e., the driver circuits 120 no longer receive a supply voltage) at which point the driver circuits 120 turn off.

Figure 2:
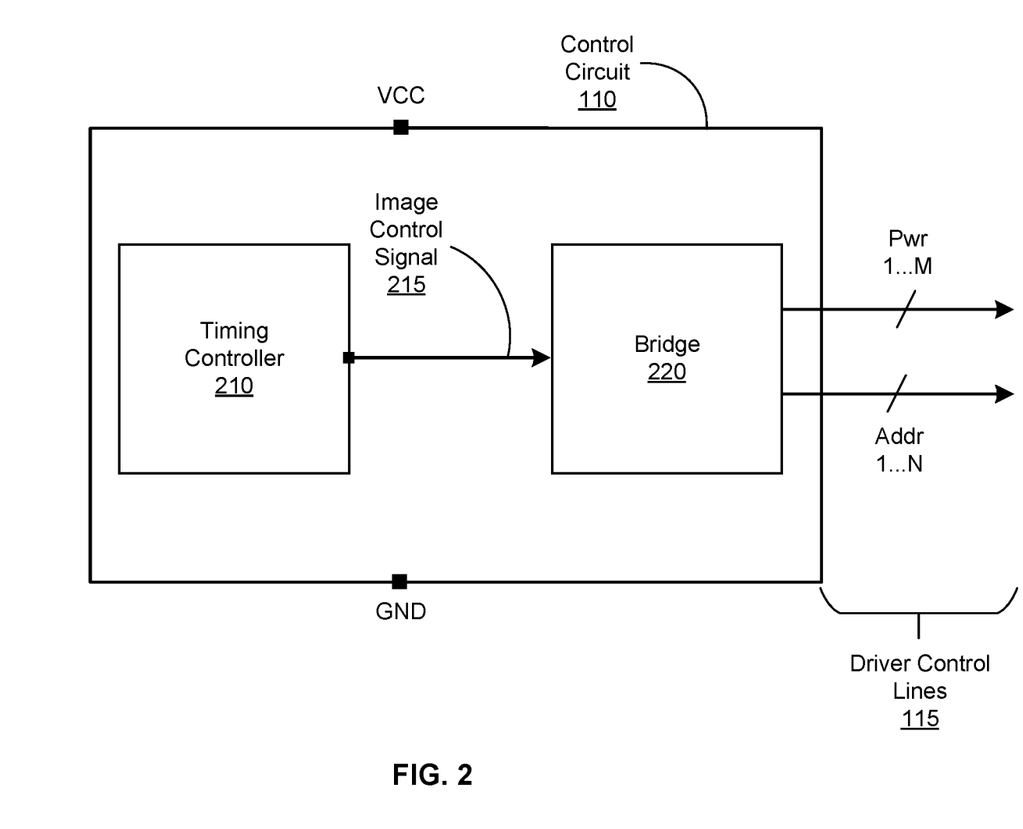
FIG. 2 is an example circuit diagram of a control circuit for a display device, according to one embodiment.

FIG. 2 is an example circuit diagram of a control circuit 110, according to one embodiment. The control circuit 110 generates the address communication signal Addr and the power line communication signal Pwr to control the display device (e.g., the display device 100) and provides the signals via the driver control lines 115 to the driver circuits 120. The control circuit 110 may include a timing controller 210 and a bridge 220. In various embodiments, the control circuit 110 may include additional, fewer, or different components. For example, in some embodiments, the control circuit 110 may be implemented using a field programmable gate array (FPGA) and/or a PHY block. The control circuit 110 is powered by an input voltage (VCC) and is connected to ground (GND). The control circuit 110 may control the display device using either active matrix (AM) or passive matrix (PM) driving methods.

The timing controller 210 generates an image control signal 215 indicating values for driving pixels of the display device 100 and timing for driving the pixels. For example, the timing controller 210 controls timing of image frames or video frames and controls timing of driving each of the LED zones 130 within an image frame or video frame. Furthermore, the timing controller 210 controls the brightness for driving each of the LED zones 130 during a given image frame or video frame. The image control signal 215 is provided by the timing controller 210 to the bridge 220.

The bridge 220 translates the image control signal 215 to the address communication signal Addr and to the driver control signals of the power line communication signal Pwr. For example, the bridge 220 may generate an address communication signal Addr for the first driver circuit 120 in the group of driver circuits 120 during the addressing mode according to the control scheme described above.

Figure 3:
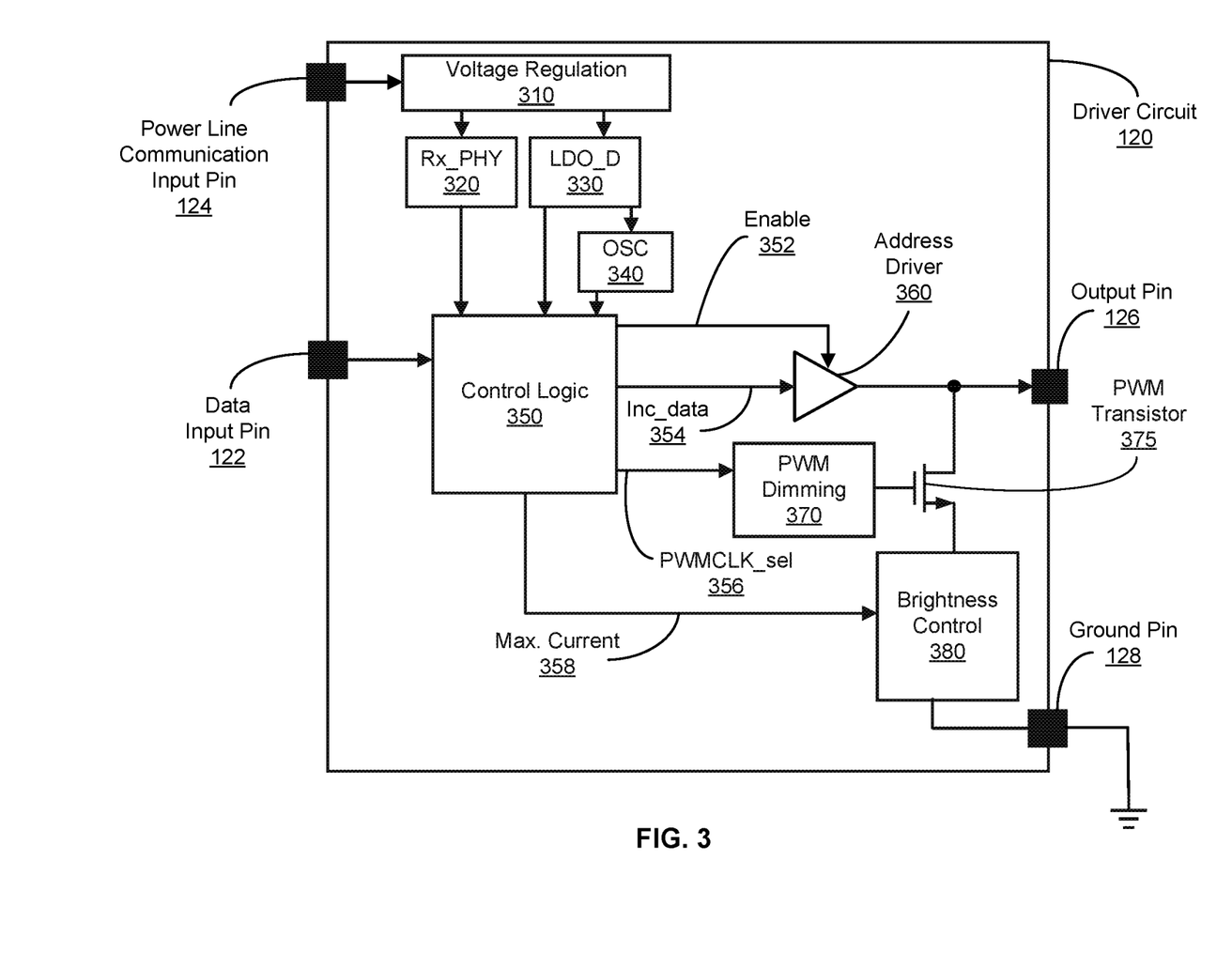
FIG. 3 is an example circuit diagram of a driver circuit for a display device, according to one embodiment.

FIG. 3 is an example circuit diagram of the driver circuit 120, according to one embodiment. The driver circuit 120 may include a voltage regulation circuit 310, an Rx_PHY 320, a low-dropout regulator LDO_D 330, an oscillator OSC 340, control logic 350, an address driver 360, a pulse width modulation (PWM) dimming circuit 370, a transistor 375, and a brightness control circuit 380. In various embodiments, the driver circuit 120 may include additional, fewer, or different components.

The voltage regulation circuit 310 demodulates the power line communication signal received at the power line communication input pin 124 into the supply voltage and the digital data. The supply voltage represents a direct current component of the power line communication signal while the digital data represents the modulated component of the power line communication signal. In an example embodiment, the voltage regulation circuit 310 comprises a first order RC filter followed by a source follower. The digital data (e.g., the driver control signal) is provided to the Rx_PHY 320. The Rx_PHY 320 is a physical layer providing a connection between the voltage regulation circuit 310 and the control logic 350. In an example embodiment, the Rx_PHY 320 provides a connection with a maximum bandwidth of 2 MHz with a cascade of 36 stages. The supply voltage is provided to the LDO_D 330. The LDO_D 330 converts the supply voltage into a steady direct current voltage (which may step down the voltage) used to power the oscillator OSC 340, the control logic 350, and other components (not shown). In an example embodiment, the steady direct current voltage may be 1.8 volts. The oscillator OSC 340 provides a clock signal. In an example embodiment, the maximum frequency of the clock signal is approximately 10.7 MHz.

The control logic 350 receives the driver control signal from the Rx_PHY 320, the direct current voltage from the LDO_D 330, and the clock signal from the oscillator OSC 340. Dependent on the mode of operation of the display device, the control logic 350 may also receive digital data from the incoming addressing signal received at the data input pin 122. Dependent on the mode of operation, the control logic 350 may output an enable signal 352, an incremented data signal Inc_data 354, a PWM clock selection signal PWMCLK_sel 356, and a maximum current signal Max. Current 358. During the addressing mode, the control logic 350 activates the enable signal 352 to enable the address driver 360. The control logic 350 receives an incoming address signal via the data input pin 122, stores the address, and provides the incremented data signal Inc_data 354 representing an outgoing address to the address driver 360. The address driver 360 buffers the incremented data signal Inc_data 354 to the output pin 126 when the enable signal 352 is activated during the addressing mode. The control logic 350 may control the PWM dimming circuit 370 to turn off the transistor 375 during the addressing mode to effectively block the current path from the LEDs.

During the operational mode and configuration modes, the control logic deactivates the enable signal 352 and the output of the address driver 360 is tri-stated to effectively decouple it from the output pin 126. During the operation mode, the PWM clock selection signal PWMCLK_sel 356 specifies a duty cycle for controlling PWM dimming by the PWM dimming circuit 370. Based on the selected duty cycle, the PWM dimming circuit 370 controls timing of an on-state and an off-state of the transistor 375. During the on-state of the transistor 375, a current path is established from the output pin 126 (coupled to the LED zones 130) to the ground pin 128 through the transistor 375 and the brightness control circuit 380 sinks the driver current through the LEDs of the LEDs zones 130. During an off-state of the transistor 375, the current path is interrupted to block current from flowing through the LED zones 130. The brightness control circuit 380 receives the maximum current signal Max. Current 358 from the control logic 350 and controls the current level that flows through the LEDs (from the output pin 126 to the ground pin 128) when the transistor 375 is in the on-state. During the operational mode, the control logic 350 controls the duty cycle of the PWM dimming circuit 370 and the maximum current Max.

Current 358 of the brightness control circuit 380 to set the LED zones 130 to the desired brightness.

Figure 4A:
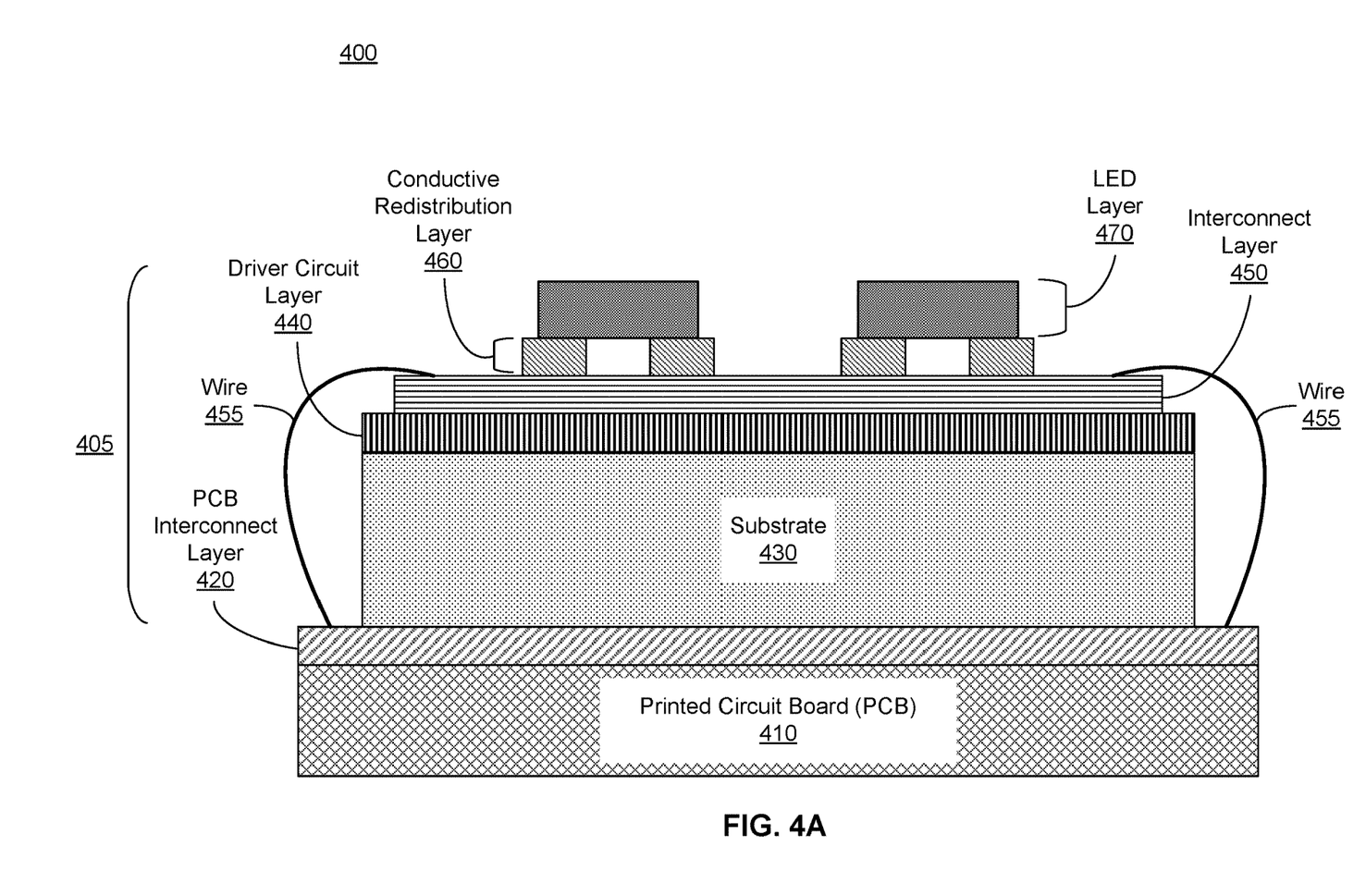
FIG. 4A is a cross sectional view of a first embodiment of an LED and driver circuit that may be utilized in a display device.

FIG. 4A is a cross sectional view of a first embodiment of a display device 400 including an integrated LED and driver circuit 405.

In the example shown in FIG. 4A, the display device 400 includes a printed circuit board (PCB) 410, a PCB interconnect layer 420, and the integrated LED and driver circuit 405 which comprises a substrate 430, a driver circuit layer 440, an interconnect layer 450, a conductive redistribution layer 460, and an LED layer 470. Bonded wires 455 may be included for connections between the PCB interconnect layer 420 and the integrated LED and driver circuit 405. The PCB 410 comprises a support board for mounting the integrated LED and driver circuit 405, the control circuit 110 and various other supporting electronics. The PCB 410 may include internal electrical traces and/or vias that provide electrical connections between the electronics. A PCB interconnect layer 420 may be formed on a surface of the PCB 410. The PCB interconnect layer 420 includes pads for mounting the various electronics and traces for connecting between them.

The integrated LED and driver circuit 405 includes the substrate 430 that is mountable on a surface of the PCB interconnect layer 420. The substrate 430 may be, e.g., a silicon (Si) substrate. In other embodiments, the substrate 430 may include various materials, such as gallium arsenide (GaAs), indium phosphide (InP), gallium nitride (GaN), aluminum nitride (AlN), sapphire, silicon carbide (SiC), or the like.

The driver circuit layer 440 may be fabricated on a surface of the substrate 430 using silicon transistor processes (e.g., BCD processing). The driver circuit layer 440 may include one or more driver circuits 120 (e.g., a single driver circuit 120 or a group of driver circuits 120 arranged in an array). The interconnect layer 450 may be formed on a surface of the driver circuit layer 440. The interconnect layer 450 may include one or more metal or metal alloy materials, such as Al, Ag, Au, Pt, Ti, Cu, or any combination thereof. The interconnect layer 450 may include electrical traces to electrically connect the driver circuits 120 in the driver circuit layer 440 to wire bonds 455, which are in turn connected to the control circuit 110 on the PCB 410. In an embodiment, each wire bond 455 provides an electrical connection. For example, the integrated LED and driver circuit 405 may include five wire bonds including a first wire for providing the driver control signal from the control circuit 110 on the PCB 410 to one or more driver circuits 120 on the driver circuit layer 440, a second wire to provide an incoming address signal to the driver circuit layer 440, a third wire to provide an outgoing address signal from the driver circuit layer 440, a fourth wire to provide the supply voltage (e.g., VLED) to the LEDs in a LED zone 130 on the LED layer 470, and a fifth wire to provide a path to a circuit ground (GND). Additionally, the interconnect layer 450 may provide electrical connections for supplying the driver current between the driver circuit layer 440 and the conductive redistribution layer 460.

In an embodiment, the interconnect layer 450 is not necessarily distinct from the driver circuit layer 440 and these layers 440, 450 may be formed in a single process in which the interconnect layer 450 represents a top surface of the driver layer 440.

The conductive redistribution layer 460 may be formed on a surface of the interconnect layer 450. The conductive redistribution layer 460 may include a metallic grid made of a conductive material, such as Cu, Ag, Au, Al, or the like.

The LED layer 470 includes LEDs that are on a surface of the conductive redistribution layer 460. The LED layer 470 may include arrays of LEDs arranged into the LED zones 130 as described above. The conductive redistribution layer 460 provides an electrical connection between the LEDs in the LED layer 470 and the one or more driver circuits in the driver circuit layer 440 for supplying the driver current and provides a mechanical connection securing the LEDs over the substrate 430 such that the LED layer 470 and the conductive redistribution layer 460 are vertically stacked over the driver circuit layer 440.

Thus, in the illustrated circuit 405, the one or more driver circuits 120 and the LED zones 130 including the LEDs are integrated in a single package including a substrate 430 with the LEDs in an LED layer 470 stacked over the driver circuits 120 in the driver circuit layer 440. By stacking the LED layer 470 over the driver circuit layer 440 in this manner, the driver circuits 120 can be distributed in the display area 105 of a display device 100.

Figure 4B:
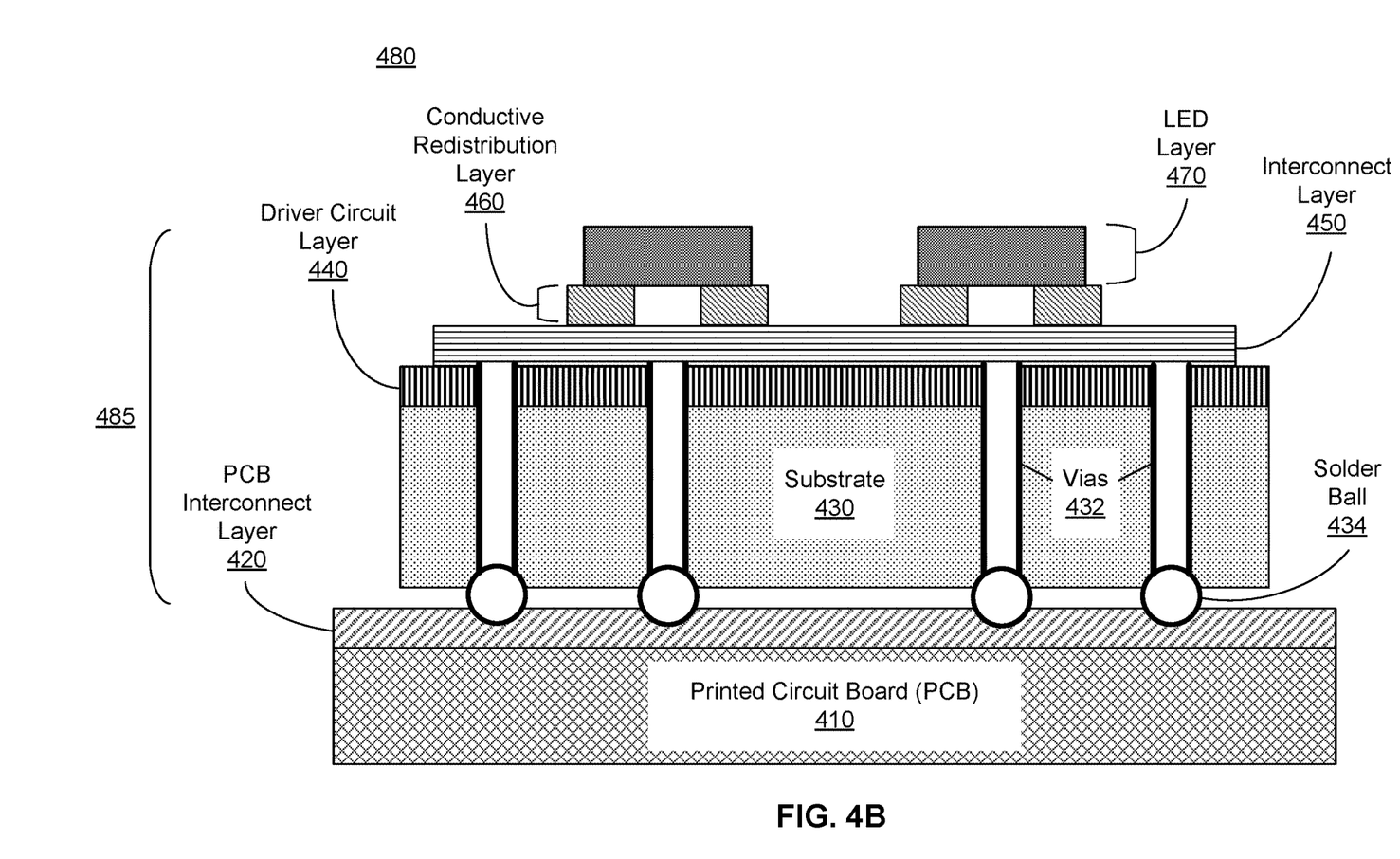
FIG. 4B is a cross sectional view of a second embodiment of an LED and driver circuit that may be utilized in a display device.

FIG. 4B is a cross sectional view of a second embodiment of a display device 480 including an integrated LED and driver circuit 485, according to one embodiment. The device 480 is substantially similar to the device 400 described in FIG. 4A but utilizes vias 432 and corresponding connected solder balls 434 to make electrical connections between the driver circuit layer 440 and the PCB 410 instead of the wires 455. Here, the vias 432 are plated vertical electrical connections that pass completely through the substrate layer 430. In one embodiment, the substrate layer 430 is a Si substrate and the through-chip vias 432 are Through Silicon Vias (TSVs). The through-chip vias 432 are etched into and through the substrate layer 430 during fabrication and may be filled with a metal, such as tungsten (W), copper (C), or other conductive material. The solder balls 434 comprise a conductive material that provide an electrical and mechanical connection to the plating of the vias 432 and electrical traces on the PCB interconnect layer 420. In one embodiment, each via 432 provides an electrical connection for providing signals such as the driver control signal from the control circuit 110 on the PCB 410 to a group of driver circuits 120 on the driver circuit layer 440. The vias 432 may also provide connections for the incoming and outgoing addressing signals, the supply voltage (e.g., VLED) to the LEDs in a LED zone 130 on the LED layer 470, and the path to a circuit ground (GND). For example, five or more vias 432 may be utilized to provide these connections.

Figure 4C:
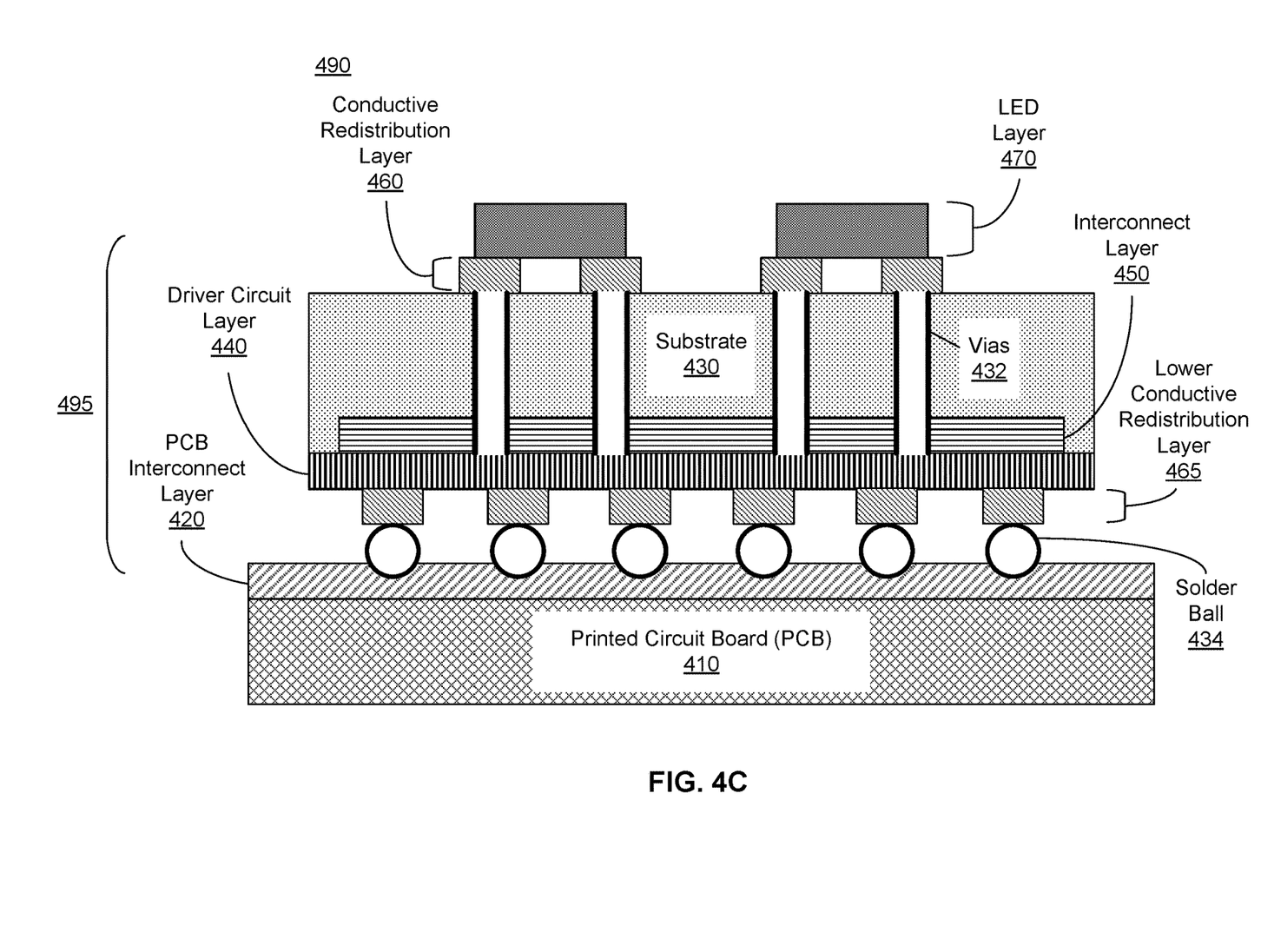
FIG. 4C is a cross sectional view of a third embodiment of an LED and driver circuit that may be utilized in a display device.

FIG. 4C is a cross sectional view of a third embodiment of a display device 490 including an integrated LED and driver circuit 495. The device 490 is substantially similar to the device 480 described in FIG. 4B but includes the driver circuit layer 440 and interconnect layer 450 on the opposite side of the substrate 430 from the conductive redistribution layer 460 and the LED layer 470. In this embodiment, the interconnect layer 450 and the driver circuit layer 440 are electrically connected to the PCB 410 via a lower conductive redistribution layer 465 and solder balls 434. The lower conductive redistribution layer 465 and solder balls 434 provide mechanical and electrical connections (e.g., for the driver control signals) between the driver circuit layer 440 and the PCB interconnect layer 420. The driver circuit layer 440 and interconnect layer 450 are electrically connected to the conductive redistribution layer 460 and the LEDs of the LED layer 470 via one or more plated vias 432 through the substrate 430. The one or more vias 432 seen in FIG. 4C may be utilized to provide the driver currents from the driver circuits in the driver circuit layer 440 to the LEDs in the LED layer 470 and other signals as described above In alternative embodiments, the integrated driver and LED circuits 405, 485, 495 may be mounted to a different base such as a glass base instead of the PCB 410.

Figure 5:
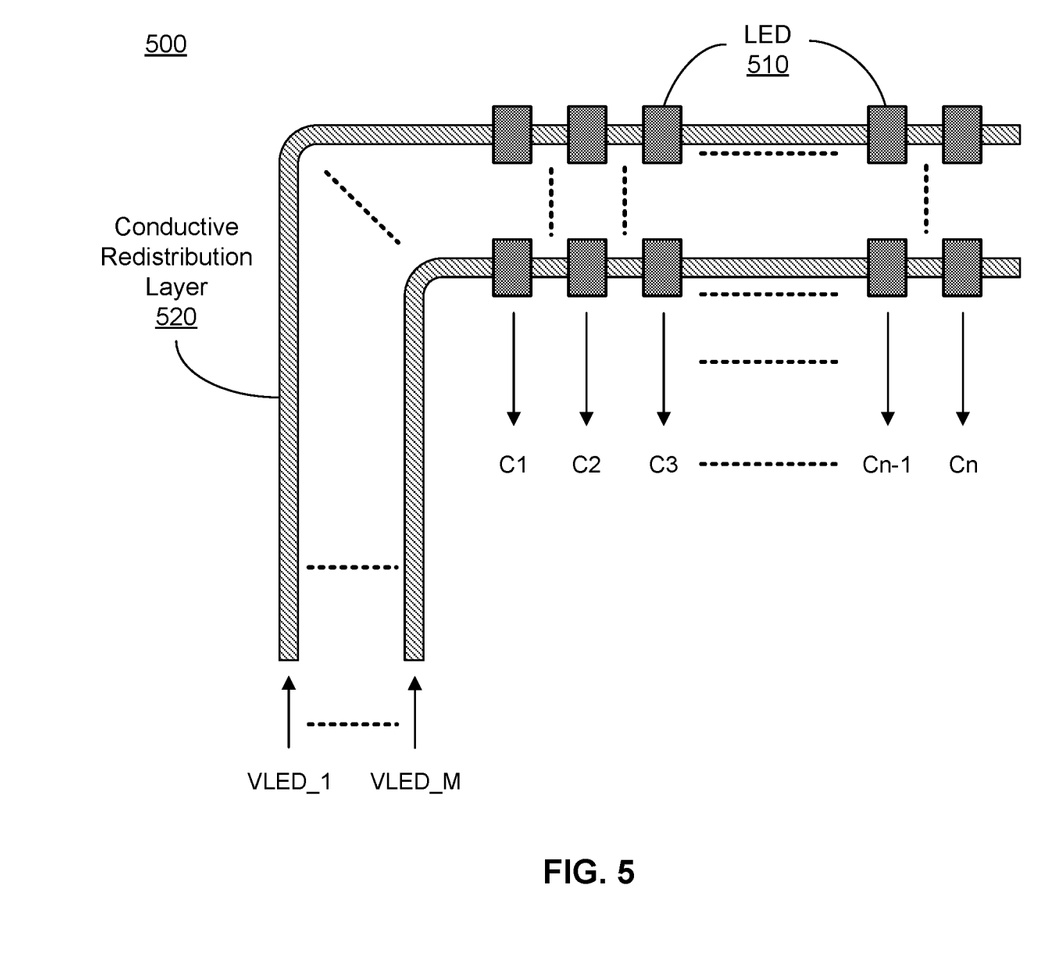
FIG. 5 is a top down view of a display device using an LED and driver circuit, according to one embodiment.

FIG. 5 is a top down view of a display device using an integrated LED and driver circuit 500, according to one embodiment. The circuit 500 can correspond to a top view of any of the integrated LED and driver circuits 405, 485, 495 depicted in FIGS. 4A-4C. A plurality of LEDs 510 is arranged in rows and columns (e.g., C1, C2, C3, . . . Cn−1, Cn) in FIG. 5. For passive matrix architectures, each row of LEDs 510 is connected by a conductive redistribution layer 520 to a demultiplexer which outputs a plurality of VLED signals (i.e., VLED_1 . . . VLED_M). The VLED signals provide power (i.e., a supply voltage) to a corresponding row of LEDs 510 via the conductive redistribution layer 520.

Figure 6:
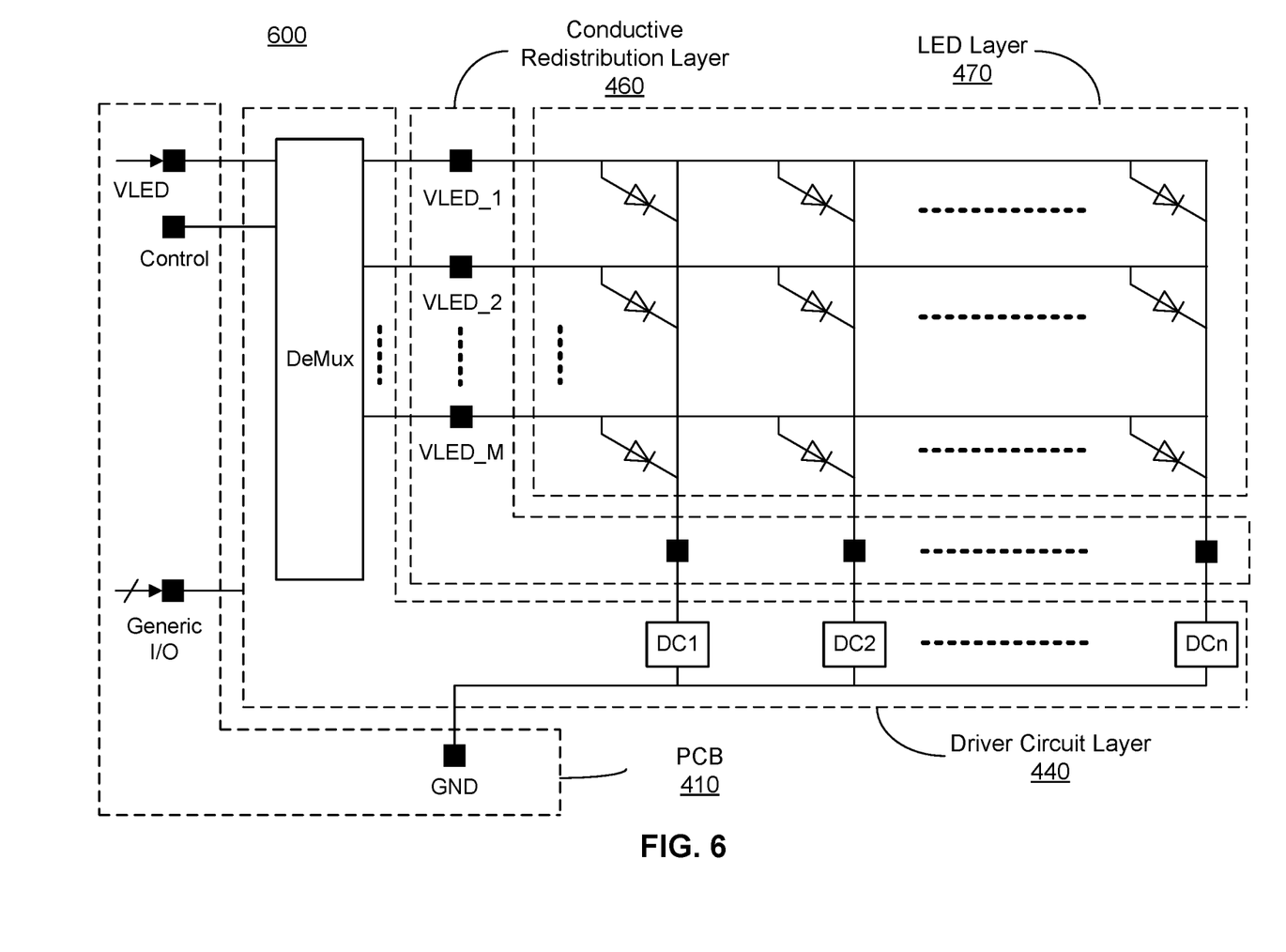
FIG. 6 illustrates a schematic view of several layers of an LED and driver circuit for a display device, according to one embodiment.

FIG. 6 illustrates a schematic view of several layers of a display device 600 with an integrated LED and driver circuit, according to one embodiment. The schematic view includes the PCB 410, the driver circuit layer 440, the conductive redistribution layer 460, and the LED layer 470 as described in FIGS. 4A-4C. The schematic of FIG. 6 shows circuit connections for the circuits 405, 485, 495 of FIGS. 4A-C but does not reflect the physical layout. As described above, in the physical layout, the LED layer 470 is positioned on top of (i.e., vertically stacked over) the conductive redistribution layer 460. The conductive redistribution layer 460 is positioned on top of the driver circuit layer 440 and the driver circuit layer 440 is positioned on top of the PCB 410.

The PCB 410 includes a connection to a power source supplying power (e.g., VLED) to the LEDs, a control circuit for generating a control signal, generic I/O connections, and a ground (GND) connection. The driver circuit layer 440 includes a plurality of driver circuits (e.g., DC1, DC2, . . . DCn) and a demultiplexer DeMux. The conductive redistribution layer 460 provides electrical connections between the driver circuits and the demultiplexer DeMux in the driver circuit layer 440 to the plurality of LEDs in the LED layer 470. The LED layer 470 includes a plurality of LEDs arranged in rows and columns. In this example implementation, each column of LEDs is electrically connected via the conductive redistribution layer 460 to one driver circuit in the driver circuit layer 440. The electrical connection established between each driver circuit and its respective column of LEDs controls the supply of driver current from the driver circuit to the column. In this embodiment, each diode shown in the LED layer corresponds to an LED zone. Each row of LEDs is electrically connected via the conductive redistribution layer 460 to one output (e.g., VLED_1, VLED 2, . . . VLED_M) of the demultiplexer DeMux in the driver circuit layer 440. The demultiplexer DeMux in the driver circuit layer 440 is connected to a power supply (VLED) and a control signal from the PCB 410. The control signal instructs the demultiplexer DeMux which row or rows of LEDs are to be enabled and supplied with power using the VLED lines. Thus, a particular LED in the LED layer 470 is activated when power (VLED) is supplied on its associated row and the driver current is supplied to its associated column.

Upon reading this disclosure, those of skill in the art will appreciate still additional alternative embodiments through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope described herein.

What is claimed is:

1. A display device comprising:
   an array of light emitting diode zones each comprising one or more light emitting diodes that generate light in response to respective driver currents;
   a group of driver circuits to each drive at least one of the light emitting diode zones by controlling the respective driver currents in response to driver control signals, at least one driver circuit including a power line communication input pin for receiving a power line communication signal that supplies power to the driver circuit and an output pin, and the at least one driver circuit configured to encode one of the driver control signals as digital data modulated onto a supply voltage, and operate in at least an addressing mode and an operational mode, wherein during the operational mode the output pin of the at least one driver circuit is configured to sink a driver current that drives a corresponding light emitting diode zone, and during the addressing mode the output pin is configured to output an outgoing addressing signal;
   a power communication line providing the power line communication signal to the power line communication input pin of each of the driver circuits in the group of driver circuits; and
   a control circuit for generating the power line communication signal and providing the power line communication signal on the power communication line to power the group of driver circuits and to control the display device via the driver control signals.

2. The display device of claim 1, wherein the power line communication signal provides as digital data one or more operating parameters during a configuration mode.

3. The display device of claim 2, wherein the operating parameters include one or more of: overcurrent thresholds, overvoltage thresholds, clock division ratios, and slew rate control.

4. The display device of claim 1, wherein the power line communication signal supplies a direct current voltage between 3 and 12 volts.

5. The display device of claim 1, wherein the group of driver circuits are positioned at distributed locations in a display area of the display device.

6. The display device of claim 1, wherein the at least one driver circuit of the group of driver circuits comprises:
   the power line communication input pin;
   control logic to operate in at least the addressing mode and the operational mode, wherein in the operational mode, the control logic obtains the driver control signal from the power line communication signal and controls the driver current based on the driver control signal, and wherein in the addressing mode, the control logic obtains an incoming addressing signal, stores an address for the driver circuit based on the incoming addressing signal, and generates the outgoing addressing signal based on the incoming addressing signal;
   a data input pin to receive the incoming addressing signal during the addressing mode;
   a ground pin to couple to a circuit ground.

7. The display device of claim 1, wherein the one or more light emitting diodes in a light emitting diode zone are vertically stacked over and integrated on the same substrate as the driver circuit that drives the one or more light emitting diodes in the light emitting diode zone.

8. The display device of claim 1, wherein the group of driver circuits are arranged in an array with one light emitting diode zone vertically stacked over one driver circuit.

9. The display device of claim 1, wherein the control circuit includes:
a timing controller to generate an image control signal indicating values for driving pixels of the display device and timing for driving the pixels; and
a bridge to translate the image control signal to the driver control signals and to encode the power line communication signal with the driver control signals.

10. The display device of claim 1, wherein the power line communication signal provides as digital data one or more address words to identify a driver circuit being addressed and one or more data words for controlling brightness of the light emitting diode zone driven by the identified driver circuit.

11. The display device of claim 1, wherein the power line communication signal encodes the driver control signals using an encoding scheme that generates an encoded signal having an approximately equal amount of high data voltages and low data voltages for any arbitrary input digital data.

12. The display device of claim 1, wherein the power line communication signal encodes the driver control signals using biphase mark code encoding.

13. A driver circuit for a display device, comprising:
a power line communication input pin configured to receive a power line communication signal;
power regulation circuitry to generate a supply voltage based on a direct current component of the power line communication signal and to generate a driver control signal based on a modulated component of the power line communication signal;
control logic powered by the supply voltage to receive the driver control signal and to generate one or more brightness control signals for controlling a driver current through a light emitting diode zone based on the driver control signal; and
an output pin to couple to the light emitting diode zone and to sink the driver current through the light emitting diode zone according to the brightness control signals during an operational mode of the driver circuit, and the output pin to output an outgoing addressing signal during an addressing mode of the driver circuit.

14. The driver circuit of claim 13, further comprising:
a ground pin for coupling to a circuit ground; and
a transistor providing a current path between the output pin and the ground pin, wherein switching of the transistor is controlled by the one or more brightness control signals.

15. The driver circuit of claim 14, wherein the control logic generates the one or more brightness control signals as a pulse width modulation signal to control switching of the transistor and a current control signal to control a current level through the transistor when the transistor is turned on, the driver circuit further comprising:
a current control circuit to control the current level through the transistor according to the current control signal.

16. The driver circuit of claim 13, wherein the power line communication signal provides one or more operating parameters as digital data during a configuration mode of the driver circuit.

17. The driver circuit of claim 13, wherein the power line communication signal provides one or more address words to identify the driver circuit being addressed and one or more data words for controlling brightness of the light emitting diode zone driven by the identified driver circuit.

18. A method for controlling a driver circuit for a display device, the method comprising:
receiving, at a power line communication input pin, a power line communication signal;
generating, by power regulation circuitry, a supply voltage based on a direct current component of the power line communication signal and a driver control signal based on a modulated component of the power line communication signal;
powering control logic by the supply voltage;
receiving, by the control logic, the driver control signal;
generating, by the control logic, one or more brightness control signals for controlling a driver current through a light emitting diode zone of the display device during an operational mode of the driver circuit via an output pin of the driver circuit based on the driver control signal, and
generating, by the control logic, an outgoing addressing signal during an addressing mode, the outgoing addressing signal output via the output pin during the addressing mode.

19. The method of claim 18, wherein generating the one or more brightness control signals comprises:
generating, by the control logic, a pulse width modulation signal for controlling a pulse width of a pulse width modulation circuit driving a transistor controlling the driver current;
generating, by the control logic, a current control signal setting a current through the transistor when the transistor is in an on-state.

20. The method of claim 18, wherein the power line communication signal encodes the driver control signal using biphase mark code encoding.

* * * * *